(12) United States Patent
Jelinger

(10) Patent No.: US 6,711,031 B1
(45) Date of Patent: Mar. 23, 2004

(54) WIRE MANAGEMENT SYSTEM

(75) Inventor: Conrad A. H. Jelinger, Toledo, OH (US)

(73) Assignee: Unitrend, Inc., Toledo, OH (US)

( * ) Notice: Subject to any disclaimer, the term of this patent is extended or adjusted under 35 U.S.C. 154(b) by 0 days.

(21) Appl. No.: 10/356,942

(22) Filed: Feb. 3, 2003

(51) Int. Cl.$^7$ ................................................ H05K 7/02
(52) U.S. Cl. ....................... 361/807; 361/826; 174/72 A
(58) Field of Search ................................. 361/826, 827, 361/807, 760, 785; 439/719; 174/72 A, 138 G; 248/59

(56) References Cited

U.S. PATENT DOCUMENTS

| | | | | |
|---|---|---|---|---|
| 3,809,799 A | * | 5/1974 | Taylor ........................ | 174/68.3 |
| 3,960,425 A | * | 6/1976 | Kirk et al. ..................... | 439/55 |
| 4,771,743 A | * | 9/1988 | McDowell .............. | 123/143 C |
| 5,215,297 A | * | 6/1993 | Sato et al. .................. | 269/296 |
| 5,478,060 A | * | 12/1995 | Sugimoto et al. ........... | 269/296 |
| 5,694,678 A | * | 12/1997 | Karasik ........................ | 29/721 |
| 5,940,962 A | * | 8/1999 | Shima et al. .................. | 29/825 |
| 6,124,548 A | * | 9/2000 | Suzuki et al. ............. | 174/72 A |
| 6,398,149 B1 | * | 6/2002 | Hines et al. ................ | 242/399 |

* cited by examiner

*Primary Examiner*—David Martin
*Assistant Examiner*—Thanh S. Phan
(74) *Attorney, Agent, or Firm*—Rader, Fishman & Grauer PLLC

(57) ABSTRACT

A management system for wiring and/or cabling is disclosed. The wire management system comprises a base socket, a cable guide assembly, and a base pivot. The cable guide assembly may include a base member and at least two guide members that may be removably mounted to the base socket. The base pivot may be received within the base member for removably mounting the cable guide assembly to the base socket. The at least two guide members of the cable guide assembly orientates the wiring and/or cabling in a generally vertical direction with respect to a heat emitting device so as to minimize the surface area of the wiring and/or cabling that is exposed to a heat emitting device, thereby minimizing heat buildup within an enclosure.

7 Claims, 7 Drawing Sheets

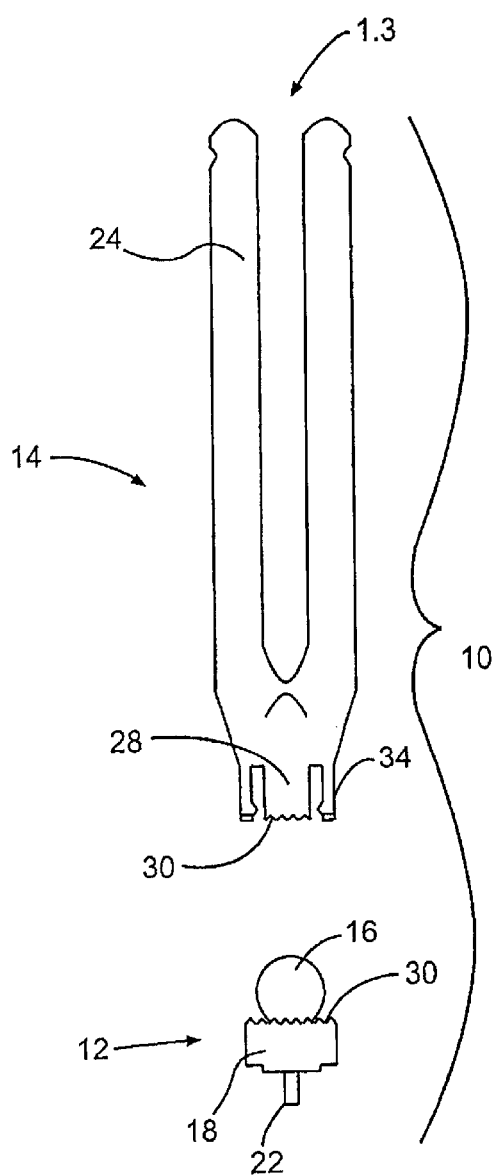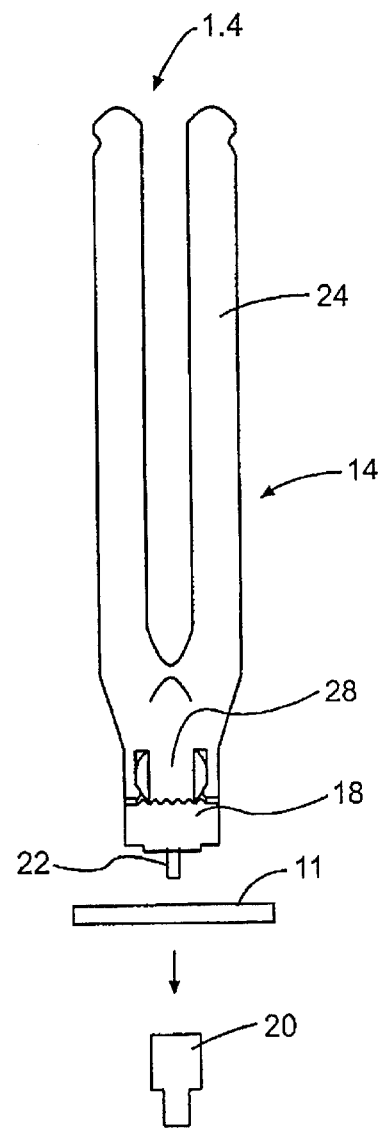
Fig. 7C
Fig. 7D

WIRE MANAGEMENT SYSTEM

BACKGROUND OF THE INVENTION

1. Field of the Invention

This invention is related to managing wires and/or cabling, and in particular to managing wires and/or cabling internally or externally in relation to an electronic system.

2. Description of the Related Art

In some electronic systems, such as a computer system with an enclosure, wires and/or cabling are run randomly from one connection point to another. The wires and/or cabling may lie on or close to one or more heat-emitting devices within the computer system enclosure, thereby trapping heat from these devices and causing excessive heat buildup within the computer system. This is especially true of ribbon cabling having a large surface area that can entirely cover the heat-emitting device.

SUMMARY OF THE INVENTION

The inventor of the present invention has recognized these and other problems and has developed a wire management system that orientates the wires and/or cabling so as to minimize the surface area of the wires and/or cabling that are exposed to the heat emitting device. As a result, the heat emitted from the device can dissipate in a more efficient fashion, thereby minimizing heat buildup within the enclosure. Because heat buildup is a major contributor to electronic component failure, the present invention greatly improves life and reliability of the heat-emitting devices.

BRIEF DESCRIPTION OF THE DRAWINGS

The present invention will now be described, by way of example, with reference to the accompanying drawings, in which:

FIGS. 7A–7E is a view showing the steps for assembling the wire management system.

DESCRIPTION OF THE PREFERRED EMBODIMENT

Figure 1:
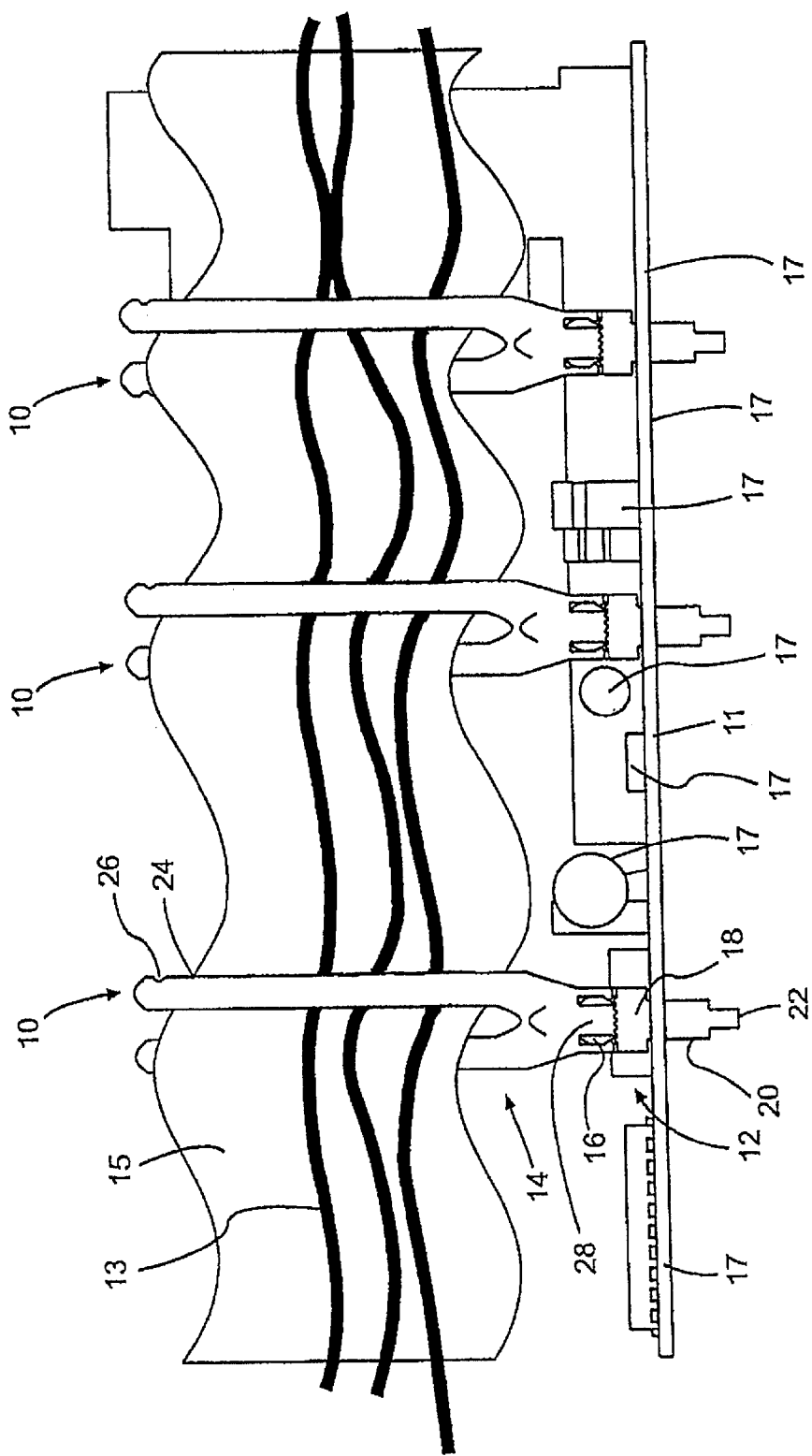
FIG. 1 is a perspective view of the wire management system cooperating with a wafer board.
Figure 2:
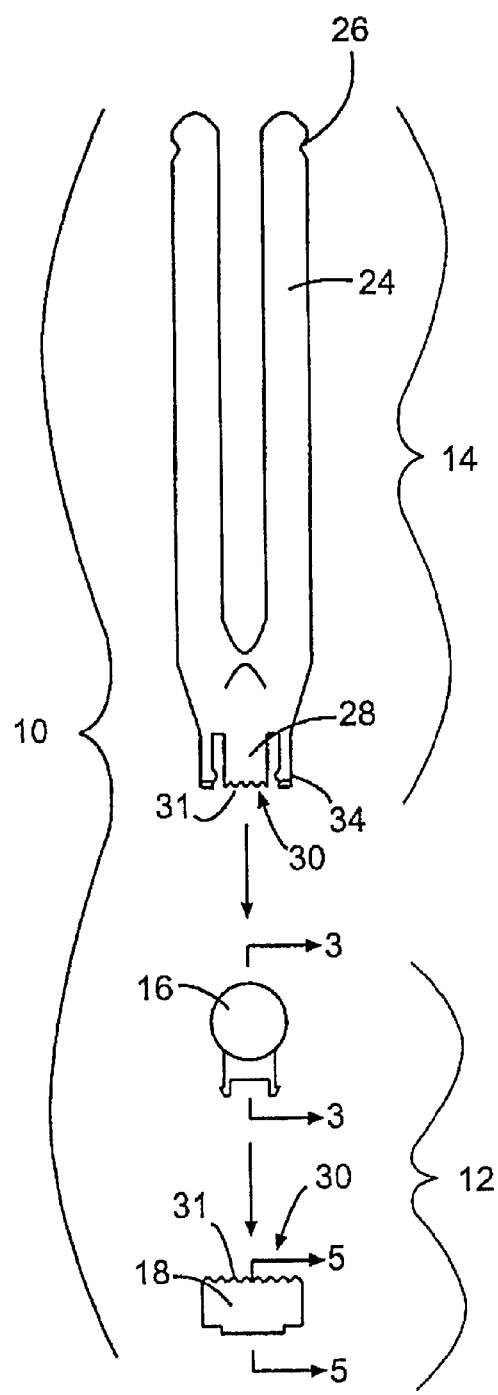
FIG. 2 is a side view of the wire management system of FIG. 1.
Figure 3:
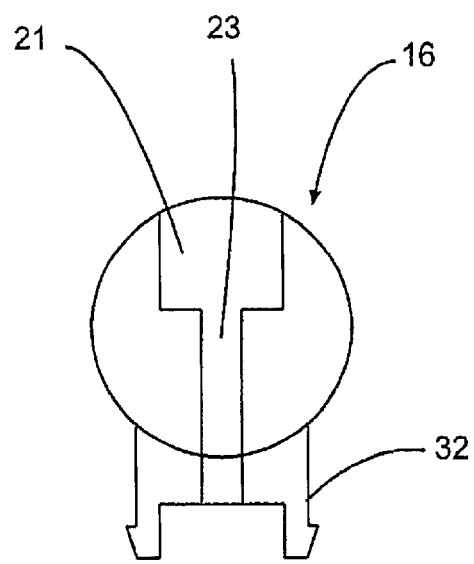
FIG. 3 is a cross-sectional view of a base pivot of the wire management system of FIG. 2.
Figure 4:
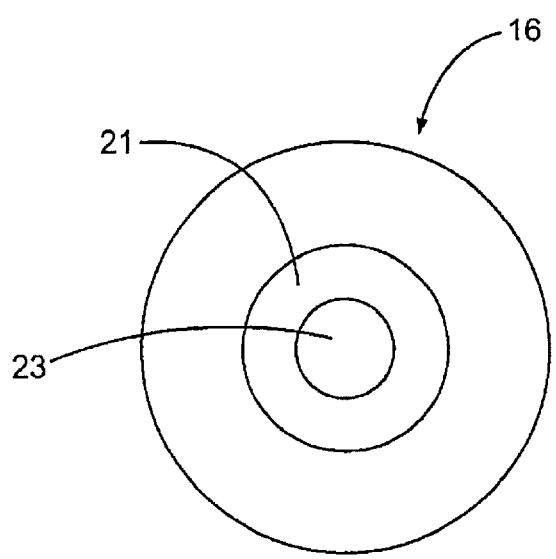
FIG. 4 is a top view of the base pivot of FIG. 3.

Referring now to FIGS. 1 and 2, a wire management system (WMS) is shown generally at 10. The WMS 10 comprises a first portion 12 and a second portion 14. The first portion 12 comprises a base pivot 16, a base socket 18, a mounting stud 20 and a mounting bolt 22. The first portion 12 provides a means for fastening the WMS 10 to an electrical component 11, such as a printed circuit board (PCB). The base socket 18 may be fastened anywhere to the electrical component 11, such as for example, a printed circuit board (PCB 11). The second portion 14 comprises a cable guide assembly defined by at least two non-conductive guide members 24 with locking notches 26 and a base member 28. The second portion 14 provides a means for suspending wires 13 and/or cabling 15 to minimize the heat build-up from a plurality of heat-emitting devices 17, such as the various components of the PCB 11. The WMS 10 is preferably made of non-conductive material, such as plastic, or the like.

As best shown in FIGS. 2–6, the base pivot 16 further comprises one or more tangs 32 for removably mounting the base pivot 16 to the base socket 18 at tang receiving apertures 33. Similarly, the base member 28 may also include one or more tangs 34 for removably mounting the first portion 14 to the base socket 18 of the second portion 12. Thus, the second portion 14 can be easily snapped to the first portion 12 by receiving the base pivot 16 within the base member 28, as shown in FIG. 2. The design of the WMS 10 permits separation of the second portion 14 from the first portion 12 in the event that excessive forces are applied to the guide members 24 in order to reduce damage to the WMS 10, the PCB 11, or any of the heat-emitting devices 17.

Figure 5:
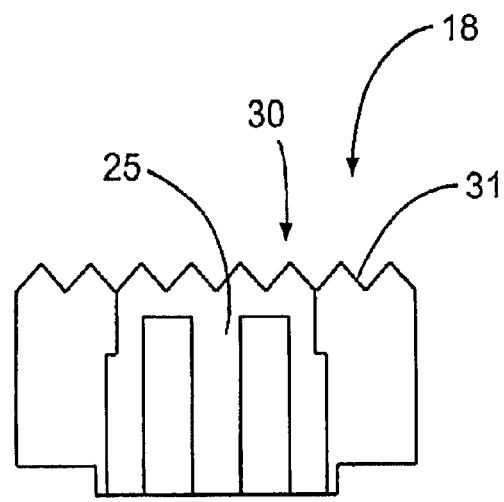
FIG. 5 is a cross-sectional view of a base socket of the wire management system of FIG. 2.
Figure 6:
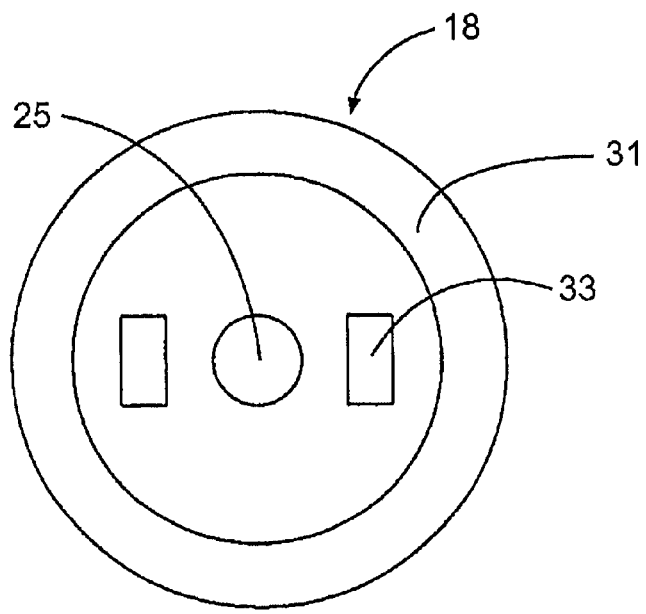
FIG. 6 is a top view of the base socket of FIG. 5.

As seen in FIGS. 2 and 5–6, the base socket 18 and the guide members 24 include cooperating mating surfaces 30 defined by a plurality of interlocking teeth 31. The cooperating mating surfaces 30 permit rotatable positioning of the at least two guide members 24 relative to the base socket 18. One aspect of the invention is that the guide members 24 permit orientation of the wires 13 and/or cabling 15 in a generally vertical direction with respect to the heat emitting devices 17. Thus, minimization of the surface area of the wiring 13 and/or cabling 15 exposed to the heat emitting devices 17 may be achieved. For example, ribbon cabling 15 having a large surface area may be generally vertically oriented, thereby reducing the surface area covering the heat-emitting devices 17 and minimizing heat build-up within the computer housing (not shown).

Figures 7A, 7B:
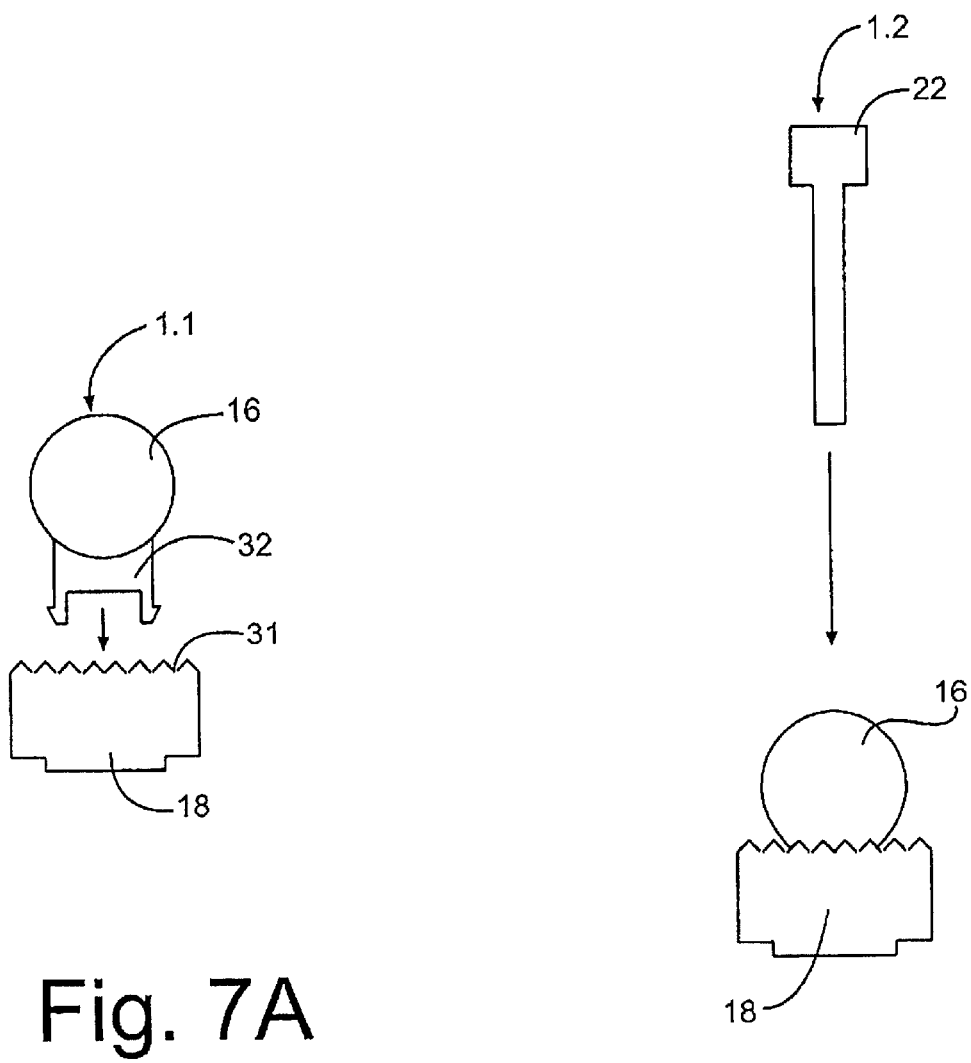
Figure 7E:
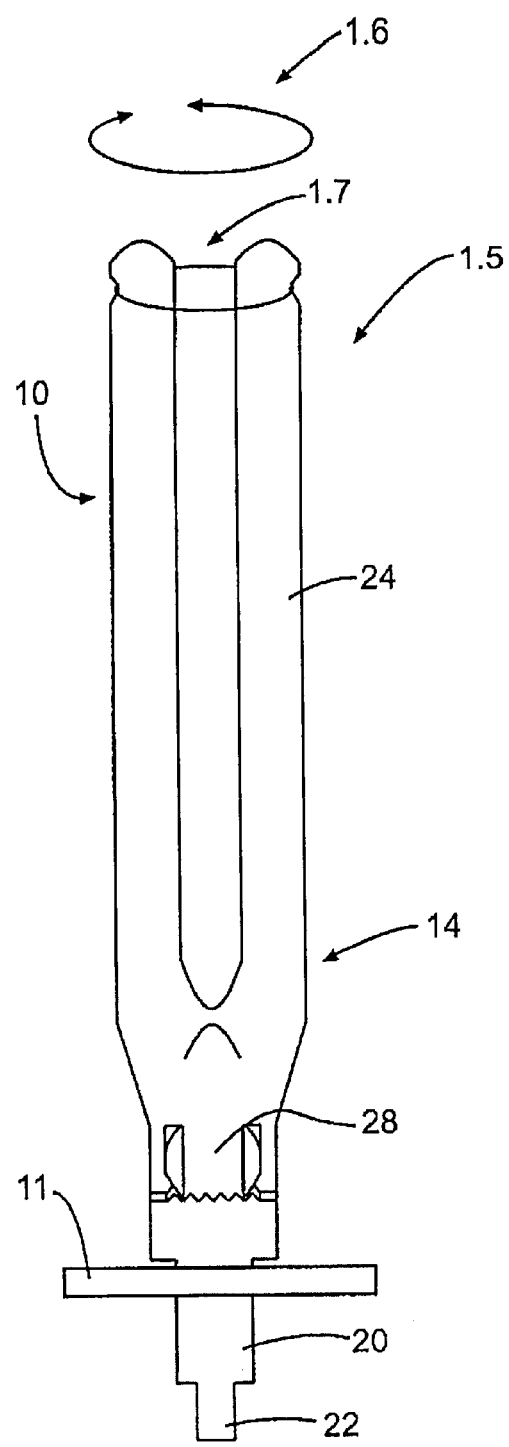

Referring now to FIGS. 7A–7E, an assembly process for mounting the WMS 10 on the PCB 11 will now be described. As shown in FIG. 7A, the tangs 32 of the base pivot 16 are first positioned over the tang receiving apertures 33 and inserted into the base socket 18. Then, a mounting bolt 22 is positioned over a central bolt-head-receiving portion or recess 21 in the base pivot 16 and bolt apertures 23, 25 in the base pivot 16 and base socket 18, respectively, as shown in FIG. 7B. Once the mounting bolt 22 is positioned as described above, the mounting bolt 22 is inserted through the bolt apertures 23, 25 of the base pivot 16 and base socket 18, respectively. Next, the base member 28 of the guide members 24 is positioned over and received by the base pivot 16, as shown in FIG. 7C. Then, the PCB 11 is intermediately located between the base socket 18 and a mounting stud 20, wherein the mounting stud 20 is positioned in a desirable location under the PCB 11, as shown in FIG. 7D. Finally, the mounting bolt 22 is inserted through the PCB 11 and into the mounting stud 20 can be tightened to positively secure the WMS 10 to the PCB 11. Once the WMS 10 is assembled on the PCB 11, the guide members 24 may be rotatably positioned by loosening the mounting stud 20 sufficiently to allow the WMS 10 to be rotated about the PCB 11. Once the wires 13 and/or cabling 15 is received between the guide members 24, a means 36 for preventing the wires 13 and/or cabling 15, such as a nylon hoop, a rubber band, or the like, may be placed within the locking notches 26 to prevent the wires 13 and/or cabling 15 from being received between the guide members 24.

As described above, the present invention properly manages the position of wires 13 and/or cabling 15 within or external to an enclosure to minimize heat buildup from the plurality of heat-emitting devices 17 within the enclosure.

This is accomplished by minimizing the surface area of the wires 13 and/or cabling 15 that is exposed to the heat-emitting devices 17 by positioning the wires 13 and/or cabling 15 in a general vertical orientation with respect to the heat-emitting devices 17. Because the WMS 10 minimizes the heat build-up within the enclosure, the present invention greatly improves equipment life and reliability of the heat-emitting devices 17. Even further, the guide members 24 of the WMS 10 may be rotatably positioned so that the path taken by the wires 13 and/or cabling 15 may be desirably orientated within or about a computer system enclosure.

While the invention has been specifically described in connection with certain specific embodiments thereof, it is to be understood that this is by way of illustration and not of limitation, and the scope of the appended claims should be construed as broadly as the prior art will permit.

What is claimed is:

1. A management system for a cable having a surface area, comprising:
   - a base socket;
   - a cable guide assembly mounted to the base socket, the cable guide assembly including a base member and at least two guide members; and
   - a base pivot received within the base member for mounting the cable guide assembly to the base socket, wherein the at least two guide members include one or more tangs for mounting the at least two guide members to the base socket, and wherein the at least two guide members orientates the cable in such a manner so as to minimize the surface area of the cable that is exposed to a heat emitting device.

2. The system according to claim 1, wherein the base socket and the at least two guide members include cooperating mating surfaces for mounting the at least two guide members to the base socket.

3. The system according to claim 1, wherein the base pivot includes one or more tangs for mounting the base pivot to the base socket.

4. The system according to claim 1, wherein the at least two guide members orientates the cable in a generally vertical direction with respect to the heat emitting device to minimize the surface area of the cable exposed to the heat emitting device.

5. A process for assembling a wire management system, comprising the steps of:
   - inserting a base pivot into a base socket to form a first portion of the wire management system;
   - inserting a mounting bolt through the first portion;
   - receiving the base pivot in a base member of a second portion of the wire management system;
   - mounting the base socket to an electrical component having at least one heat emitting device; and
   - receiving a cable between at least two guide members of the second portion in such a manner so as to minimize a surface area of the cable that is exposed to the at least one heat emitting device.

6. The process for assembling the cable guide system according to claim 5, further comprising of providing a means for preventing the cable from being receiving between the at least two guide members.

7. A management system for a cable having a surface area, comprising:
   - a base socket;
   - a cable guide assembly mounted to the base socket, the cable guide assembly including a base member and at least two guide members, wherein the at least two guide members include one or more tangs for mounting the at least two guide members to the base socket; and
   - a base pivot received within the base member for mounting the cable guide assembly to the base socket, wherein the at least two guide members orientates the cable in such a manner so as to minimize the surface area of the cable that is exposed to a heat emitting device, wherein the base socket and the at last two guide members include cooperating mating surfaces for mounting the at least two guide members to the base socket, wherein the base pivot includes one or more tangs for mounting the base pivot to the base socket, wherein the at least two guide members orientates the cable in a generally vertical direction with respect to the heat emitting device to minimize the surface area of the cable exposed to the heat emitting device.

* * * * *